(12) United States Patent
Hattori

(10) Patent No.: US 11,567,402 B2
(45) Date of Patent: Jan. 31, 2023

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Tadashi Hattori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/069,292

(22) Filed: Oct. 13, 2020

(65) Prior Publication Data

US 2021/0124261 A1 Apr. 29, 2021

(30) Foreign Application Priority Data

Oct. 23, 2019 (JP) .............................. JP2019-193006

(51) Int. Cl.
*G03F 7/00* (2006.01)
(52) U.S. Cl.
CPC .................................. *G03F 7/0002* (2013.01)
(58) Field of Classification Search
None
See application file for complete search history.

(56) References Cited

U.S. PATENT DOCUMENTS

| 10,611,063 | B2 | 4/2020 | Murayama | |
|---|---|---|---|---|
| 2011/0147970 | A1* | 6/2011 | Sato | B82Y 40/00 425/150 |
| 2017/0235220 | A1* | 8/2017 | Yamazaki | B29C 43/18 427/369 |
| 2018/0017863 | A1 | 1/2018 | Sakai | |

FOREIGN PATENT DOCUMENTS

| JP | 2018010942 A | 1/2018 |
|---|---|---|
| JP | 6315963 B2 | 4/2018 |

* cited by examiner

*Primary Examiner* — Michael P. Rodriguez
(74) *Attorney, Agent, or Firm* — Rossi, Kimms & McDowell LLP

(57) ABSTRACT

The present invention provides an imprint apparatus including a holding unit configured to hold a material, a measurement unit configured to measure a position of the material held by the holding unit, a detection unit configured to detect dechucking of the material in the holding unit, and a control unit configured to control continuation processing for continuing an imprint process if the detection unit has detected the dechucking, wherein the control unit performs, as the continuation processing, processing of causing the holding unit to hold the dechucked material again without unloading the material from the imprint apparatus, and processing of measuring, by the measurement unit, a position of the material held again by the holding unit before the imprint process to use the position for alignment in the imprint process.

11 Claims, 12 Drawing Sheets

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus that molds an imprint material on a substrate by using a mold having a pattern formed thereon has received attention as one of mass production lithography apparatuses for semiconductor devices and the like. The imprint apparatus cures the imprint material in a state in which the imprint material on the substrate is in contact with the mold and separates the mold from the cured imprint material, thereby forming an uneven pattern formed of the imprint material on the substrate.

The imprint apparatus adopts, as an alignment method between a pattern (shot region) on a substrate and a pattern of a mold, a die-by-die alignment method or a global alignment method. The die-by-die alignment method is an alignment method in which alignment between a substrate and a mold is performed for each shot region in a state in which an imprint material on the substrate is in contact with the mold. The global alignment method is an alignment method in which the layout (shot layout) of shot regions on a substrate is obtained from measurement results of positions of a plurality of sample shot regions on the substrate, and alignment between a mold and the substrate is performed based on the shot layout. In general, the imprint apparatus combines the both alignment methods. That is, an approximate shot layout on a substrate is obtained using the global alignment method, and detailed alignment for each shot region is performed using the die-by-die alignment method.

In the imprint apparatus, when separating a mold from a cured imprint material on a substrate, detachment (disengagement) of the mold or substrate from a corresponding holding mechanism, so-called dechucking may occur. Dechucking occurs when the mold separating force required to separate the mold from the cured imprint material on the substrate becomes larger than the force of holding the substrate or mold. If the imprint process is continued without detecting such dechucking, the substrate or mold may be damaged. Therefore, each of Japanese Patent No. 6315963 and Japanese Patent Laid-Open No. 2018-10942 proposes a technique of detecting dechucking (occurrence thereof) and, if dechucking has occurred, causing a corresponding holding mechanism to hold a mold or substrate again.

In the imprint apparatus, even if dechucking has occurred, a pattern of the imprint material (a cured product of the imprint material) has been formed without problem in the shot region, that is, the shot region in which the mold and the substrate are attached to each other via the imprint material. Therefore, once the dechucking is solved, the imprint process is continued, and the substrate with which the dechucking has occurred would not be wasted. Since this is related to productivity, it is particularly useful in a mass production process of semiconductor devices or the like.

However, even if the substrate with which the dechucking has occurred is held again by the holding mechanism, it would be held by the holding mechanism while being shifted from the holding position before the occurrence of the dechucking. Therefore, if the imprint process for a subsequent shot region of the substrate held again by the holding mechanism is performed using the alignment information of the substrate before the occurrence of the dechucking, an alignment error (shift) occurs. For example, in the global alignment method, the shot layout obtained before the occurrence of the dechucking is significantly different from the shot layout after the occurrence of the dechucking. Also, even in the die-by-die alignment method, the moving amount of the substrate or mold required for alignment in a state in which the imprint material on the substrate is in contact with the mold increases, so that the distorted shape of the pattern formed on the substrate, so-called a distortion occurs.

SUMMARY OF THE INVENTION

The present invention provides an imprint apparatus advantageous in continuing an imprint process even when dechucking has occurred.

According to one aspect of the present invention, there is provided an imprint apparatus that performs an imprint process of forming a pattern of an imprint material on a substrate using a mold, including a holding unit configured to hold one of the mold and the substrate as a material, a measurement unit configured to measure a position of the material held by the holding unit, a detection unit configured to detect dechucking of the material in the holding unit, and a control unit configured to control continuation processing for continuing the imprint process if the detection unit has detected the dechucking, wherein the control unit performs, as the continuation processing, processing of causing the holding unit to hold the dechucked material again without unloading the material from the imprint apparatus, and processing of measuring, by the measurement unit, a position of the material held again by the holding unit before the imprint process to use the position for alignment between the mold and the substrate in the imprint process.

Further aspects of the present invention will become apparent from the following description of exemplary embodiments with reference to the attached drawings.

DESCRIPTION OF THE EMBODIMENTS

Figure 1:
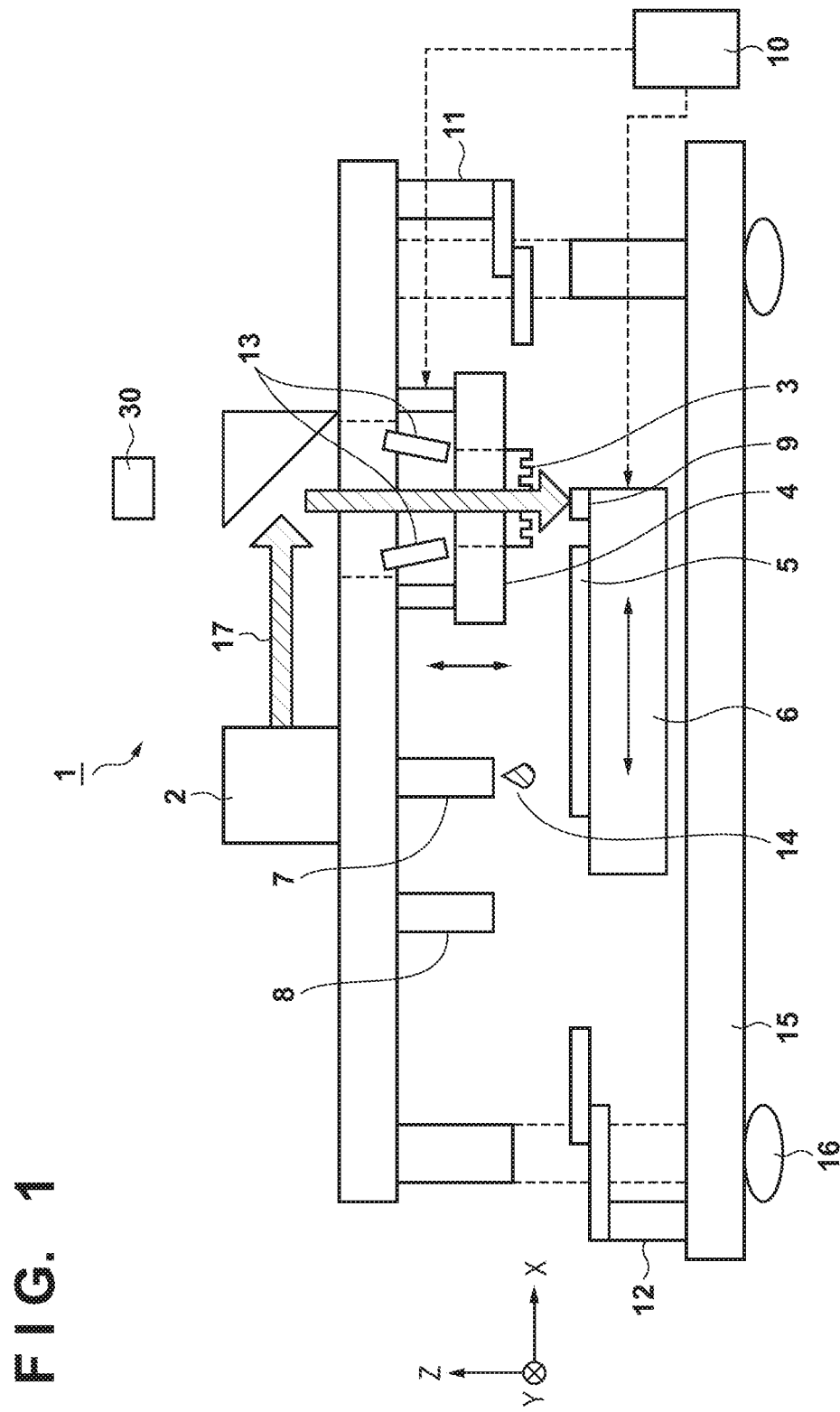
FIG. 1 is a schematic view showing the arrangement of an imprint apparatus 1 as one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an imprint apparatus 1 as one aspect of the present invention. The imprint apparatus 1 is a lithography apparatus (processing apparatus) that is used in a manufacturing process of a semiconductor device or the like, and transfers an uneven pattern of an original onto a substrate. In this embodiment, the imprint apparatus 1 performs an imprint process of forming a pattern of an imprint material on a substrate using a mold (mask) as an original. The imprint apparatus 1 brings a mold into contact with an uncured imprint material supplied onto (arranged on) a substrate and applies curing energy to the imprint material, thereby forming a pattern of a cured product to which an uneven pattern of the mold is transferred.

As the imprint material, a curable composition (to be also referred to as a resin in an uncured state) to be cured by receiving curing energy is used. Examples of the curing energy are an electromagnetic wave and the like. As the electromagnetic wave, for example, light selected from the wavelength range of 10 nm (inclusive) to 1 mm (inclusive) is used. Examples of the electromagnetic wave are infrared light, a visible light beam, and ultraviolet light.

The curable composition is a composition cured with light irradiation. The photo-curable composition cured by light irradiation contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used. A member made of a material different from that of the substrate may be formed on the surface of the substrate, as needed. More specifically, examples of the substrate are a silicon wafer, a semiconductor compound wafer, and silica glass.

The imprint apparatus 1 adopts a photo-curing method as the imprint technique. The imprint apparatus 1 includes an irradiation unit 2, an imprint head 4, a substrate stage 6, a supply unit 7, a mold conveyance unit 11, and a substrate conveyance unit 12. The imprint apparatus 1 further includes a reference mark 9, a substrate measurement scope 8, TTM (Through The Mask) scopes 13, an image capturing unit 30, and a control unit 10.

During an imprint process, the irradiation unit 2 irradiates an imprint material 14 on a substrate with ultraviolet light 17 via a mold 3. The irradiation unit 2 includes, for example, a light source, and a plurality of optical elements for adjusting the ultraviolet light 17 emitted from the light source to a state appropriate for the imprint process.

The mold 3 includes, on a surface facing a substrate 5, a pattern region in which a predetermined pattern (for example, an uneven pattern such as a circuit pattern) is formed in a three-dimensional shape. The mold 3 is made of a material that transmits the ultraviolet light 17. Examples of the material are quartz and the like.

The imprint head 4 is a holding unit for holding (fixing) the mold 3 (material). The imprint head 4 includes a Z-driving mechanism that moves (drives) the mold 3 in the Z direction while holding the mold 3. In addition, the imprint head 4 may include an inclination correction mechanism that inclines the mold 3 (the entire mold 3) in accordance with the inclination of the mold 3 or the substrate 5.

The TTM scopes 13 are provided inside the imprint head 4 and above the mold 3. The TTM scope 13 is an alignment scope including an optical system and an image capturing system for detecting a mark (alignment mark) provided on the substrate 5 and a mark (alignment mark) provided on the mold 3. The TTM scope 13 measures positional shifts (positional shift amounts) in the X and Y directions between the substrate 5 (the shot region on the substrate) and the mold 3 (the pattern region thereof). The TTM scope 13 also functions as a measurement unit that measures the position of the mold 3 (material) held by the imprint head 4.

The substrate stage 6 is a substrate holding unit that holds the substrate 5 (material) and is movable freely on the X-Y plane. The substrate stage 6 preferably includes a rotation mechanism that rotates the substrate 5 around the Z-axis. Further, the substrate stage 6 may include a Z-driving mechanism that moves (drives) the substrate 5 in the Z direction or a rotation mechanism that rotates the substrate 5 around the X-axis and the Y-axis to substitute the Z-driving mechanism or the inclination correction mechanism of the imprint head 4.

The substrate stage 6 moves along a stage base 15. The stage base 15 has a structure that insulates a vibration from the floor via base mounts 16. In this embodiment, by arranging the entire imprint apparatus 1 on the base mounts 16, it is not affected by the vibration from the floor.

The reference mark 9 is provided on the substrate stage 6. The reference mark 9 includes a mark identical with the mark provided on the substrate 5, and can be measured by the TTM scope 13 and the substrate measurement scope 8.

The substrate measurement scope 8 is a scope for detecting the mark provided on the substrate 5, thereby measuring the position of the underlying pattern (shot region) formed on the substrate 5. In this embodiment, the substrate measurement scope 8 functions as a measurement unit that measures the position of the substrate 5 (material) held by the substrate stage 6.

The supply unit 7 has a function of supplying the uncured imprint material 14 onto the substrate and includes, for example, a dispenser that discharges the imprint material 14 to each shot region on the substrate. In this embodiment, the imprint material 14 is a photo-curable imprint material that is cured by receiving the ultraviolet light 17 from the irradiation unit 2.

The mold conveyance unit 11 has a function of conveying the mold 3, and conveys the mold 3 between a storage unit that stores the mold 3 and the imprint head 4. The substrate conveyance unit 12 has a function of conveying the substrate 5, and conveys the substrate 5 between a conveyance port for loading and unloading the substrate 5 and the substrate stage 6.

The image capturing unit 30 is configured (arranged) to include, in its field of view, the pattern region of the mold 3 held by the imprint head 4, and captures at least one of the mold 3 and the substrate 5 to obtain an image. The image capturing unit 30 is a camera (spread camera) that observes the contact state between the imprint material 14 on the substrate and the mold 3 in the imprint process.

The control unit 10 is formed by a computer (information processing apparatus) including a CPU, a memory, and the like, and operates the imprint apparatus 1 by comprehensively controlling the respective units of the imprint apparatus 1 in accordance with programs stored in a memory unit. The control unit 10 controls the imprint process and various kinds of processing operations related to the imprint process.

In addition to the respective units described above, the imprint apparatus 1 includes a sensor that measures the height and inclination of the surface (pattern region) of the mold 3, a sensor that measures the height and inclination of the surface of the substrate 5, and the like, but a detailed description thereof is omitted here.

Figure 2:
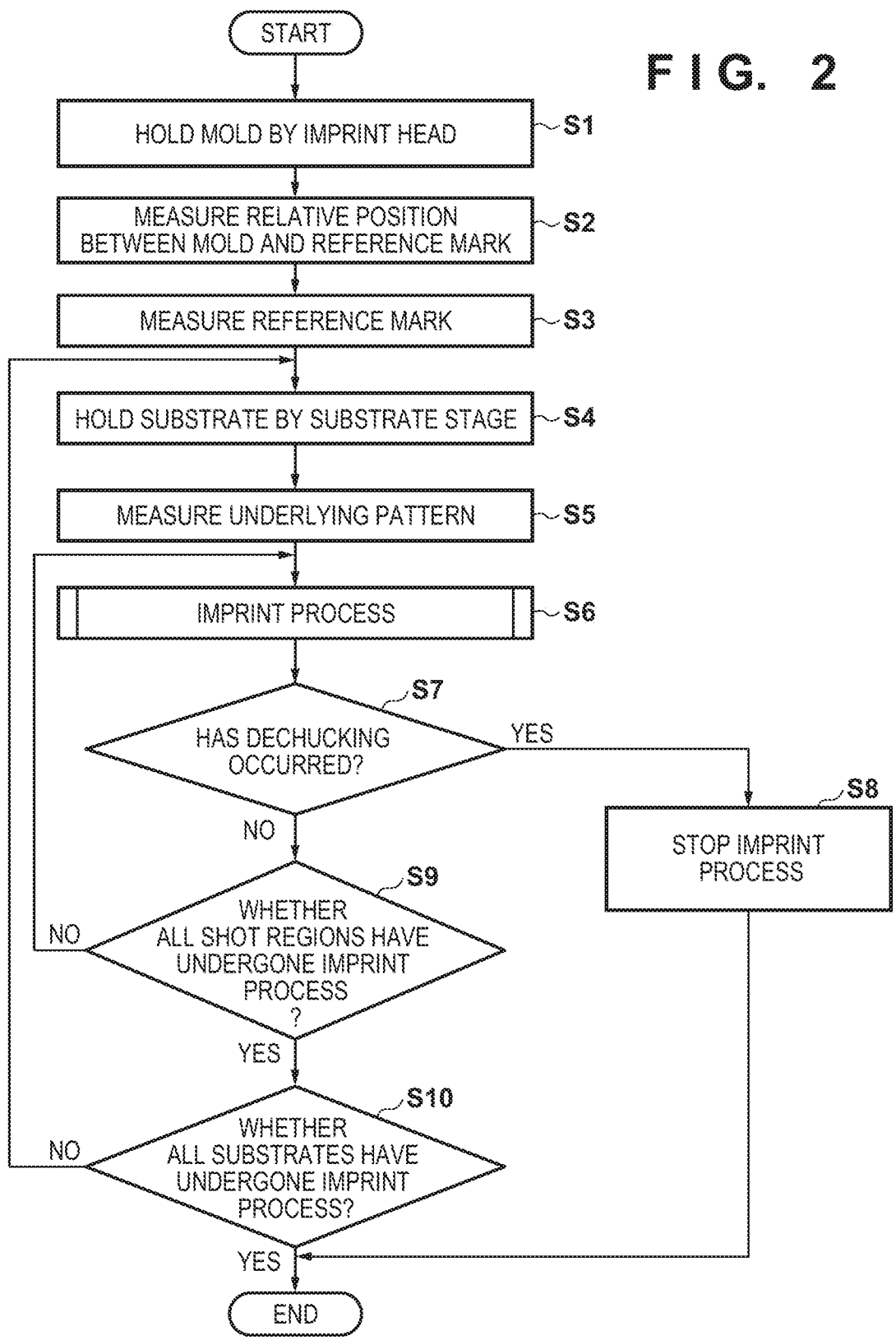
FIG. 2 is a flowchart for explaining an operation of the imprint apparatus.
Figure 3A:
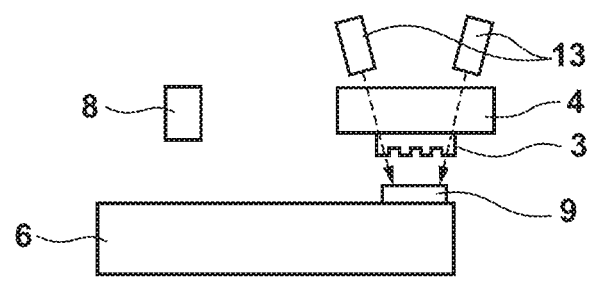
FIGS. 3A to 3C are views conceptually showing steps related to alignment in the operation of the imprint apparatus shown in FIG. 2.
Figure 3B:
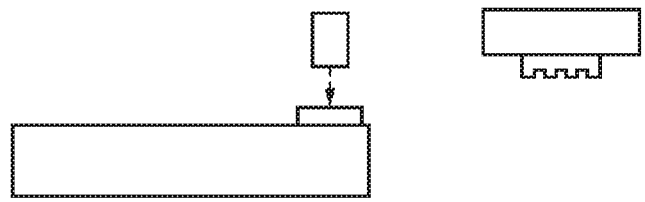
Figure 3C:
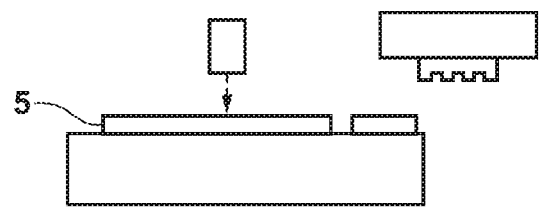

With reference to FIG. 2 and FIGS. 3A to 3C, a general operation of the imprint apparatus 1 will be described. FIG. 2 is a flowchart for explaining the general operation of the imprint apparatus 1. FIGS. 3A to 3C are views conceptually showing steps related to alignment in the general operation of the imprint apparatus 1, more specifically, steps S2, S3, and S5. As has been described above, the imprint apparatus 1 is operated by the control unit 10 comprehensively controlling the respective units of the imprint apparatus 1.

In step S1, the imprint head 4 holds the mold 3. More specifically, the mold conveyance unit 11 conveys the mold 3 to be used in the imprint process to the imprint head 4, and the imprint head 4 holds the mold 3. The imprint head 4 holds (chucks) the mold 3 by vacuum chucking.

In step S2, the TTM scope 13 measures a relative position between the mold 3 and the reference mark 9. FIG. 3A is a view conceptually showing step S2. In step S2, a positional shift of the mold 3 (the pattern thereof) with respect to the reference mark 9 is obtained. This processing will be referred to as "mold alignment" hereinafter.

In step S3, the substrate measurement scope 8 measures the reference mark 9. FIG. 3B is a view conceptually showing step S3. In step S3, a relative position (positional relationship) between the substrate measurement scope 8 and the reference mark 9 is obtained.

A relative position (positional relationship) between the mold 3 (the pattern thereof) and the substrate measurement scope 8 can be obtained from the positional shift obtained in step S2 and the relative position obtained in step S3 via the reference mark 9.

In step S4, the substrate stage 6 holds the substrate 5. More specifically, the substrate conveyance unit 12 conveys the substrate 5 to the substrate stage 6, and the substrate stage 6 holds the substrate 5. The substrate stage 6 holds (chucks) the substrate 5 by vacuum chucking.

In step S5, the substrate measurement scope 8 measures the underlying pattern (shot region) formed on the substrate 5. FIG. 3C is a view conceptually showing step S5. Since the positional relationship between the pattern of the mold 3 and the substrate measurement scope 8 has been already obtained, by adding the result in step S5, a relative position (positional relationship) between the pattern of the mold 3 and the underlying pattern of the substrate 5 can be eventually obtained.

Here, in step S5, in general, only representative shot regions (some shot regions among a plurality of shot regions) on the substrate are set as sample shot regions, and the underlying pattern in each sample shot region is measured. Then, the layout (shot layout) of the shot regions on the substrate is obtained by function approximation from the measurement results in the sample shot regions. This processing will be referred to as "global alignment" hereinafter. The global alignment is more advantageous in throughput than measuring the underlying patterns in all the shot regions on the substrate, die-by-die prealignment to be described later, and the like. Note that the underlying patterns in all the shot regions on the substrate may be measured. This leads to a decrease in throughput, but is advantageous in alignment accuracy. The number of shot regions whose underlying patterns are measured (the number of sample shot regions) may be determined so as to satisfy the required alignment accuracy and maximize the throughput.

By performing steps S1 to S5, the relative position between the pattern of the mold 3 and the underlying pattern of the substrate 5 is obtained as described above. Based on the relative position between the pattern of the mold 3 and the underlying pattern of the substrate 5 obtained in this manner, an imprint process is performed in step S6 in which the imprint material 14 on the substrate is brought into contact with the mold 3 to form the pattern on the substrate.

Figure 4:
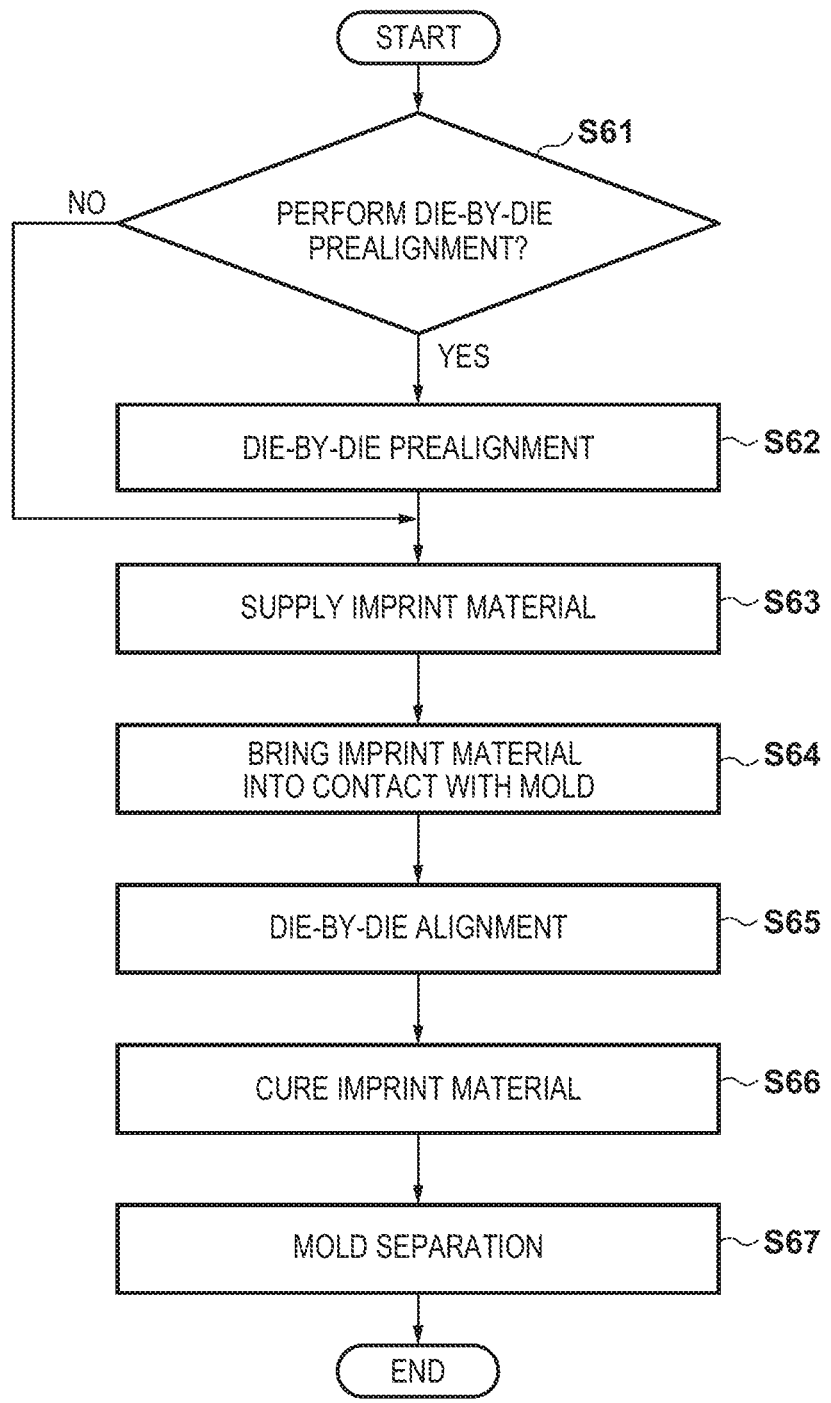
FIG. 4 is a flowchart for explaining an imprint process.

With reference to FIG. 4 and FIGS. 5A to 5E, the imprint process will be described. FIG. 4 is a flowchart for explaining the imprint process. FIGS. 5A to 5E are views conceptually showing steps in the imprint process, more specifically, steps S62 to S65 and S67.

In step S61, it is determined whether to perform die-by-die prealignment. Regarding the alignment accuracy, global alignment generally suffices, so die-by-die prealignment may not be performed. However, depending on the type and thickness of the coating agent on the surface of the substrate 5 or the shape and type of the mark, a measurement difference may occur between the substrate measurement scope 8 and the TTM scope 13. In such a case, die-by-die prealignment is preferably performed for the first one or several shot regions after replacement of the substrate 5. If die-by-die prealignment is performed, the process advances to step S62. On the other hand, if die-by-die prealignment is not performed, the process advances to step S63.

Figure 5A:
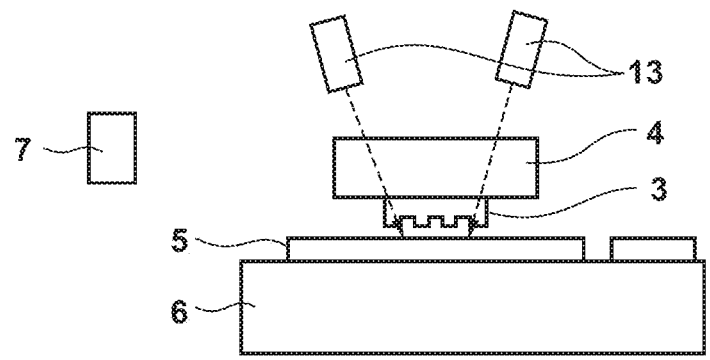
FIGS. 5A to 5E are views conceptually showing respective steps in the imprint process shown in FIG. 4.

In step S62, die-by-die prealignment is performed. FIG. 5A is a view conceptually showing step S62, that is, the die-by-die prealignment. In the die-by-die prealignment, the substrate stage 6 is first moved so as to position the shot region of the substrate 5 immediately below the mold 3, and the imprint head 4 is lowered to such an extent that the mold 3 does not contact the shot region of the substrate 5. For example, the imprint head 4 is lowered such that the gap between the mold 3 and the substrate 5 becomes several μm to several tens of μm. Note that the gap between the mold 3 and the substrate 5 depends on the focal depth of the TTM scope 13. By simultaneously detecting the mark of the mold 3 and the mark of the substrate 5 by the TTM scope 13, a relative position between the marks is measured. The shape of the mark of the mold 3 and the shape of the mark of the substrate 5 in the die-by-die prealignment may be similar to the shape of a general mark used in an exposure apparatus, so that a detailed description thereof is omitted here.

Note that the method of simultaneously detecting the mark of the mold 3 and the mark of the substrate 5 by the TTM scope 13 is excellent in measurement accuracy, but unless the relative positions of them match each other to some extent, the mark of the mold 3 and the mark of the substrate 5 cannot be detected in many cases. This is because if the marks overlap with each other or if the marks are apart from each other more than an allowable range, image processing cannot be performed. In addition, when using moire, moire does not occur unless the marks overlap with each other. Accordingly, compared to the measurement (step S5) of the underlying pattern of the substrate 5 by the substrate measurement scope 8, the allowable positional shift amount of each mark is small in the die-by-die prealignment. Further, if the relative positional shift amount between the mark of the mold 3 and the mark of the substrate 5 exceeds the allowable range, it is necessary to move the substrate stage 6 so as to bring the relative positional shift amount into the allowable range. Therefore, the die-by-die prealignment often requires a longer time than the measurement (step S5) of the underlying pattern of the substrate 5 by the substrate measurement scope 8. Thus, in general, the shot layout on the substrate is obtained in advance by the global alignment, and further highly accurate alignment (accurate measurement) is implemented by the die-by-die prealignment.

The substrate measurement scope 8 is also called an off-axis scope since it is provided at a position apart from the position at which the imprint material 14 on the substrate is brought into contact with the mold 3 (the imprint position at which the mold 3 is pressed against the substrate 5 via the imprint material 14). Since the off-axis scope is not restricted by the mechanism such as the imprint head 4, a highly accurate scope having a large field of view can be used. Particularly, since the substrate 5 has a large conveyance error or shot layout error component, the substrate measurement scope 8 needs to use a scope having a large field of view. Therefore, it is preferable to adopt the off-axis scope.

Figure 5B:
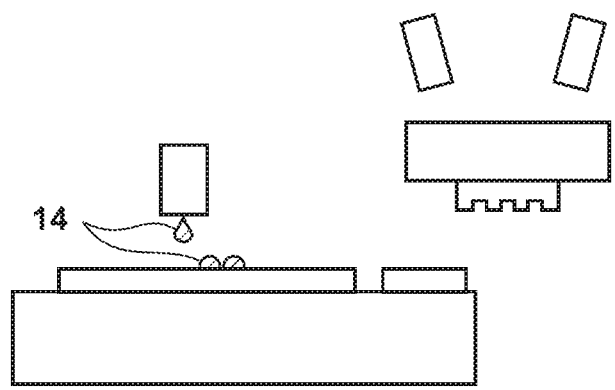

In step S63, the supply unit 7 supplies the imprint material 14 to a shot region (a shot region to be the target of the imprint process) on the substrate. FIG. 5B is a view conceptually showing step S63. Since the position (shot layout) of the shot region on the substrate has been already measured, the supply unit 7 may supply the imprint material 14 based on the measurement result.

Figure 5C:
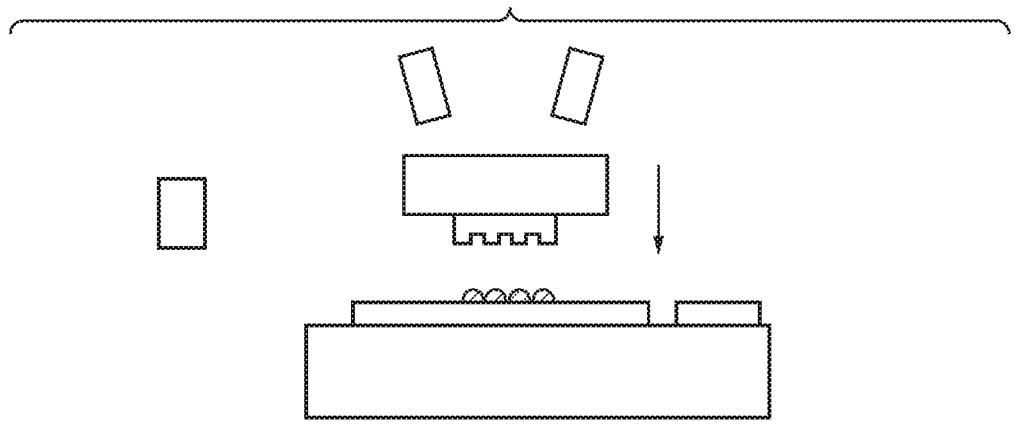

In step S64, the imprint material 14 on the substrate and the mold 3 are brought into contact with each other. FIG. 5C is a view conceptually showing step S64. More specifically, based on the positional relationship between the mold 3 and the shot region on the substrate obtained so far, the substrate stage 6 is first moved such that the shot region with the imprint material 14 supplied thereon is positioned at the imprint position. Then, the imprint head 4 is lowered to bring the imprint material 14 on the substrate into contact with the mold 3. This operation will be referred to as "mold pressing" hereinafter.

Figure 5D:
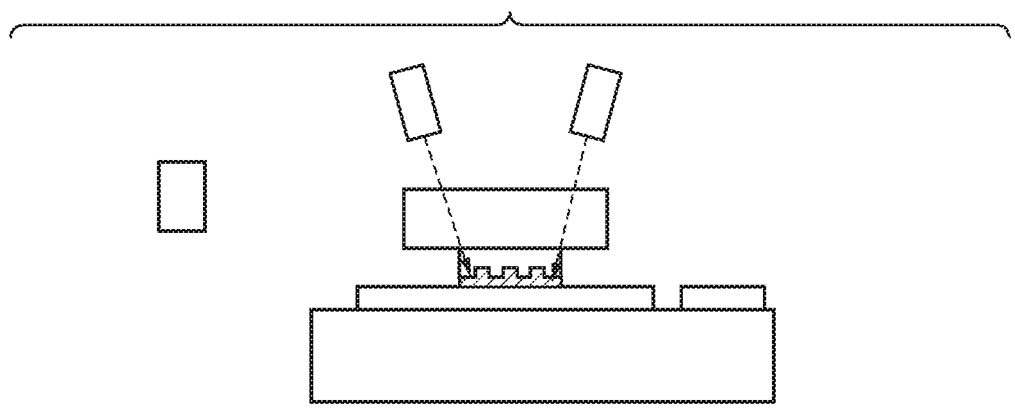

In step S65, die-by-die alignment is performed. FIG. 5D is a view conceptually showing step S65. In the die-by-die alignment, alignment between the pattern of the mold 3 and the shot region on the substrate is performed while detecting the mark of the mold 3 and the mark of the substrate 5 by the TTM scope 13 in a state in which the imprint material 14 is in contact with the mold 3. Since the die-by-die alignment directly aligns the mark of the mold 3 and the mark of the substrate 5, it is possible to implement highly accurate alignment between the pattern of the mold 3 and the shot region on the substrate. However, in the die-by-die alignment, it is necessary to move the substrate stage 6 in the state in which the imprint material 14 is in contact with the mold 3. At this time, if the moving amount of the substrate stage 6 is large, the distorted shape of the pattern formed on the substrate, so-called a distortion occurs. Therefore, it is desirable to perform the global alignment and the die-by-die prealignment in advance to reduce the moving amount of the substrate stage 6 required in the die-by-die alignment.

In step S66, the imprint material 14 on the substrate is cured. More specifically, in the state in which the imprint material 14 on the substrate is in contact with the mold 3, the irradiation unit 2 irradiates the imprint material 14 with the ultraviolet light 17 via the mold 3 at a timing of completion of the die-by-die alignment, thereby curing the imprint material 14.

Figure 5E:
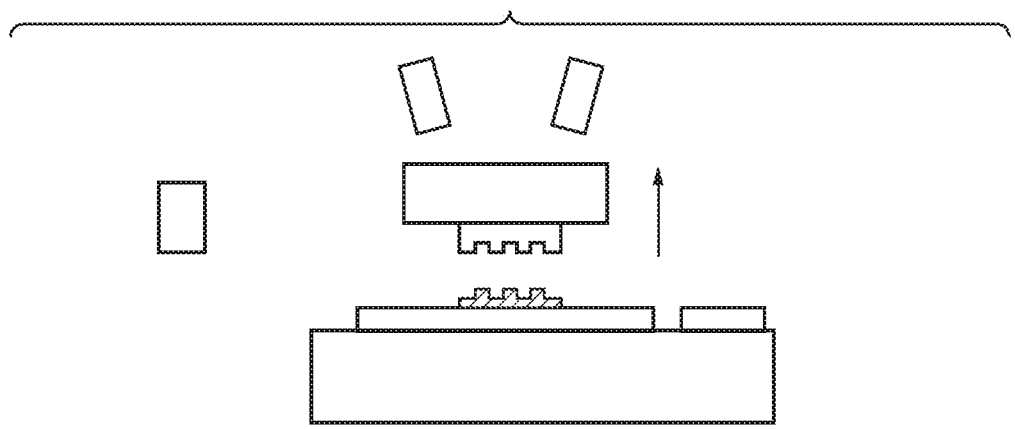

In step S67, the mold 3 is separated from the cured imprint material 14 on the substrate. FIG. 5E is a view conceptually showing step S67. In the state in which the cured imprint material 14 on the substrate is in contact with the mold 3, the imprint head 4 is lifted to separate the mold 3 from the imprint material 14. This operation will be referred to as "mold separation" hereinafter.

Referring back to FIG. 2, once the imprint process for one shot region on the substrate is completed, it is determined in step S7 whether dechucking of either the mold 3 or the substrate 5 has occurred (whether dechucking of either the mold 3 or the substrate 5 is detected). Here, dechucking means detachment of the mold 3 from the imprint head 4 holding the mold 3 or detachment of the substrate 5 from the substrate stage 6 holding the substrate 5. If the dechucking is detected, the process advances to step S8. On the other hand, if the dechucking is not detected, the process advances to step S9.

In step S8, the imprint process is stopped. This is because the dechucking has occurred and the mold 3 or the substrate 5 may be damaged if the imprint process is continued.

In step S9, it is determined whether all the shot regions on the substrate have undergone the imprint process. If not all the shot regions on the substrate have undergone the imprint process, the process advances to Step S6 to perform the imprint process on a next shot region. On the other hand, if all the shot regions on the substrate have undergone the imprint process, the process advances to step S10.

In step S10, it is determined whether all substrates have undergone the imprint process. If not all substrates have undergone the imprint process, the process advances to step S4 to perform the imprint process on a next substrate. On the other hand, if all substrates have undergone the imprint process, the operation is terminated.

Here, dechucking will be described in detail. In the imprint process, at the time of mold separation (step S67), detachment (disengagement) of the substrate 5 from the substrate stage 6, so-called dechucking may occur. For example, as described in Japanese Patent No. 6315963, in order to reduce the defect of the pattern formed on the substrate, if the chucking pressure of the substrate stage 6 vacuum-chucking the substrate 5 is decreased to bend the substrate 5 at the time of mold separation, dechucking is particularly likely to occur.

Figure 6A:
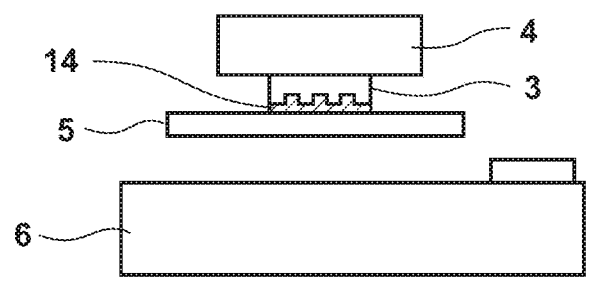
FIGS. 6A and 6B are views schematically showing dechucking of a substrate and dechucking of a mold, respectively.
Figure 6B:
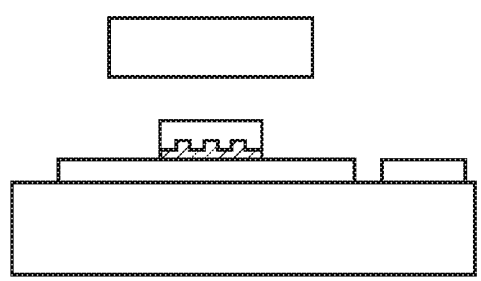

FIG. 6A is a view conceptually showing a state in which the substrate 5 is detached from the substrate stage 6, that is, dechucking of the substrate 5. If the imprint process is continued in a state in which dechucking of the substrate 5 has occurred, the substrate stage 6 is moved while the substrate 5 is attached to the mold 3 via the imprint material 14. This may cause a drop of the substrate 5 to a place other than the substrate stage or contact of the substrate 5 with a structure provided on the substrate stage 6, for example, the reference mark 9, so that the substrate 5 or the reference mark 9 may be damaged. Further, as shown in FIG. 6B, also in a case in which the mold 3 is detached from the imprint head 4, that is, in a case in which dechucking of the mold 3 has occurred, as in the case of dechucking of the substrate 5, it is difficult to continue the imprint process.

Therefore, the imprint apparatus 1 includes a detection unit that detects dechucking of the mold 3 and dechucking of the substrate 5. For example, the image capturing unit 30 can be used as the detection unit. Dechucking of the mold 3 and the dechucking of the substrate 5 can be detected from an image obtained by the image capturing unit 30. Further, a sensor that constantly monitors the chucking pressure of the substrate stage 6 with respect to the substrate 5 and the chucking pressure of the imprint head 4 with respect to the mold 3 may be used as the detection unit. For example, if the chucking pressure monitored by the sensor falls within a set range, it is considered that no dechucking has occurred (normal), and if the chucking pressure monitored by the sensor falls outside the set range (in general, if it is approaching the atmospheric pressure value), it is considered that dechucking has occurred.

When such a detection unit has detected the dechucking, if the safety of the imprint process is prioritized, the imprint process may be stopped as shown in FIG. 2. On the other hand, if throughput is prioritized, even when the detection unit has detected the dechucking, the dechucking may be solved (restored) and the imprint process may be continued.

Here, processing of solving dechucking will be described. In general, if dechucking of the substrate 5 has occurred at the time of mold separation, as shown in FIG. 6A, the substrate stage 6 is supposed to be positioned immediately below the substrate 5 attached to the mold 3 via the imprint material 14. Accordingly, the dechucking of the substrate 5 can be solved by lowering the imprint head 4, causing the substrate stage 6 to hold again the substrate 5 attached to the mold 3, and performing mold separation again when the chucking pressure of the substrate stage 6 with respect to the substrate 5 has reached within the set range (normal). At this time, by making the chucking pressure of the substrate stage 6 with respect to the substrate 5 larger than the chucking pressure at the time of occurrence of the dechucking, it is possible to reduce the possibility of reoccurrence of dechucking. Similarly, dechucking of the mold 3 can be solved by causing the imprint head 4 to hold again the mold 3 attached to the substrate 5, and performing mold separation again when the chucking pressure of the imprint head 4 with respect to the mold 3 has reached within the set range.

In this manner, dechucking as a problem specific to the imprint apparatus 1 can be detected and solved. Further, even if dechucking has occurred, the pattern of the imprint material has been formed in the shot region. Therefore, once the dechucking is solved, it is possible to continue the imprint process for remaining shot regions. Particularly, since productivity is very important in the mass production process of semiconductor devices, it is necessary to solve the dechucking and continue the imprint process.

However, for example, if the substrate stage 6 is caused to hold the substrate 5 again to solve dechucking, a positional shift of the substrate 5 or a distortion of the substrate 5 occurs upon causing the substrate stage 6 to hold the substrate 5 again. In the global alignment, the shot layout (the positional relationship between the substrate measurement scope 8 and the mark in each shot region of the substrate 5) is stored, but if dechucking of the substrate 5 occurs, this shot layout cannot be used for the global alignment. Particularly, in a case of a pattern called a critical layer with a narrow line width, since a positioning accuracy of the order of several nm is required, it is difficult to cause the substrate stage 6 to hold the substrate 5 again while maintaining such the accuracy. On the other hand, if die-by-die alignment is performed in such a state, the moving amount of the substrate stage 6 increases as described above, resulting in occurrence of a distortion.

Further, a similar problem occurs also in a case of dechucking of the mold 3. As has been described above, in the mold alignment shown in FIG. 3A, by measuring the relative position between the mold 3 and the reference mark 9, the relative position between the mold 3 and the substrate 5 can be eventually obtained. However, if dechucking of the mold 3 occurs, even if the imprint head 4 is caused to hold the mold 3 again, it is difficult to maintain a positioning accuracy of the order of several nm. Accordingly, the relative position between the mold 3 and the substrate 5 obtained by the mold alignment cannot be used.

Therefore, this embodiment provides a technique (continuation processing for continuing the imprint process) of, even if dechucking has occurred, solving the dechucking and enabling continuation of the imprint process.

Figure 7:
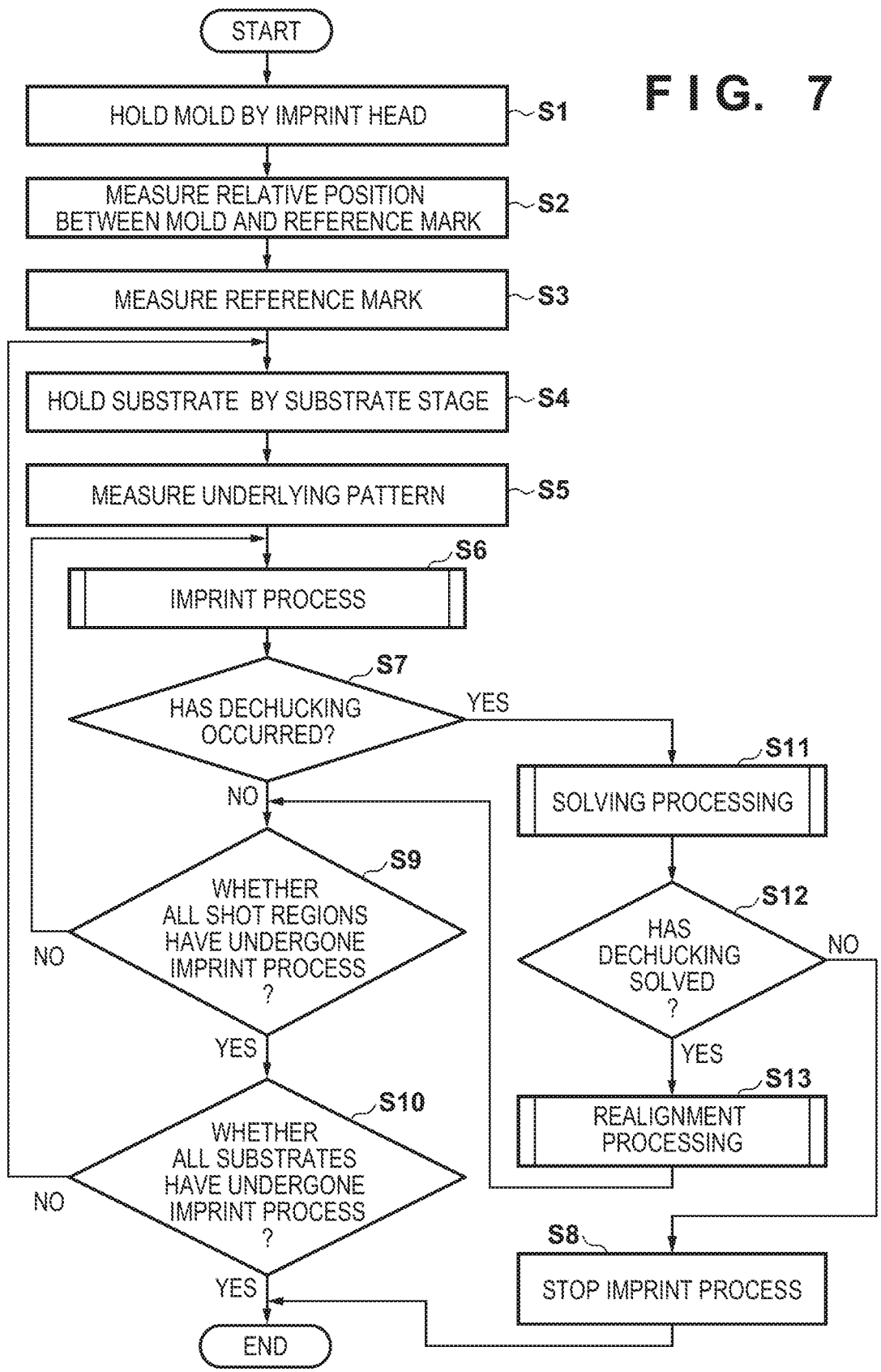
FIG. 7 is a flowchart for explaining an operation of the imprint apparatus according to an embodiment.

FIG. 7 is a flowchart for explaining an operation of the imprint apparatus 1 in this embodiment. According to this embodiment, even if dechucking has occurred, it is possible to solve the dechucking and continue the imprint process. The operation of the imprint apparatus 1 in this embodiment is different from the general operation shown in FIG. 2 in that steps S11, S12, and S13 are added as steps to be performed if dechucking of either the mold 3 or the substrate 5 has occurred (YES in step S7). Steps S11, S12, and S13 will be described below.

Figure 8:
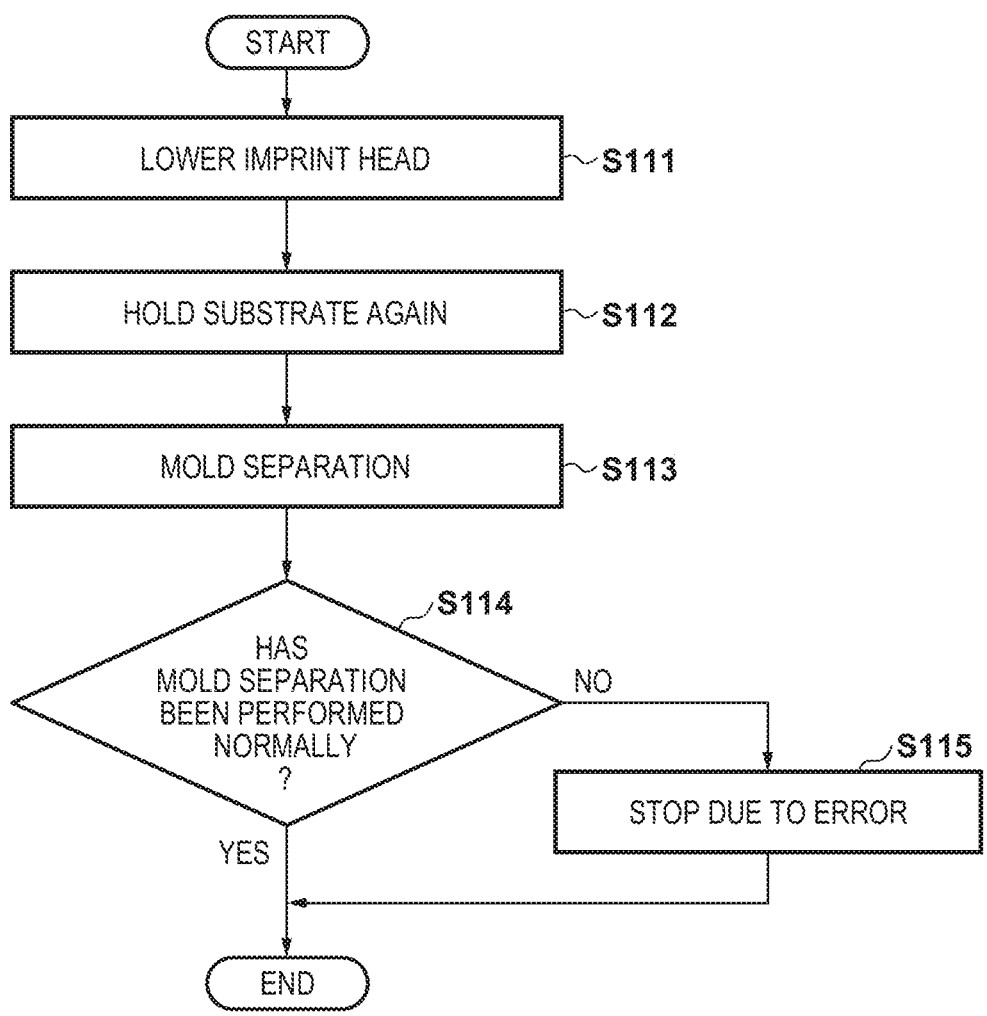
FIG. 8 is a flowchart for explaining solving processing.

In step S11, processing (solving processing) for solving the dechucking is performed. Regardless of whether it is dechucking of the mold 3 shown in FIG. 6A or dechucking of the substrate 5 shown in FIG. 6B, basically, the dechucking can be solved by performing respective steps (a sequence) described below with reference to FIG. 8. FIG. 8 is a flowchart for explaining the solving processing. Dechucking of the substrate 5 will be described here as an example.

In step S111, the imprint head 4 holding the mold 3 to which the substrate 5 is attached via the imprint material 14 is lowered. Basically, the imprint head 4 need only be lowered to the imprint position.

In step S112, the substrate stage 6 is caused to hold the substrate 5 again. At this time, as has been described above, it is preferable to make the chucking pressure of the substrate stage 6 with respect to the substrate 5 larger than the chucking pressure at the time of occurrence of the dechucking, that is, the chucking pressure at the time of the imprint process.

In step S113, mold separation is performed. The mold separation in the solving processing is similar to the mold separation (step S67) in the imprint process, so that a detailed description thereof is omitted here.

In step S114, it is determined whether the mold separation has been performed normally (that is, whether no dechucking has occurred). Here, normal mold separation means a state in which the mold 3 is completely separated from the cured imprint material 14 on the substrate, the mold 3 is held by the imprint head 4, and the substrate 5 is held by the substrate stage 6. If the mold separation has been performed normally, the solving processing is terminated. On the other hand, if the mold separation has not been performed normally (that is, dechucking has occurred again), the process advances to step S115.

In step S115, the imprint apparatus 1 is stopped due to an error, and the solving processing is terminated. Note that even if the mold separation has not been performed normally, instead of stopping the imprint apparatus 1 due to an error, the process may advance to step S113 and mold separation may be performed again. In this case, the maximum number of repetitions is set, and if the dechucking is not solved even after the maximum number of repetitions, the imprint apparatus 1 may be stopped due to an error.

Referring back to FIG. 7, in step S12, it is determined whether the dechucking has been solved by the solving processing shown in FIG. 8. If the dechucking has not been solved, the process advances to step S8. On the other hand, if the dechucking has been solved, the process advances to step S13.

Figure 9:
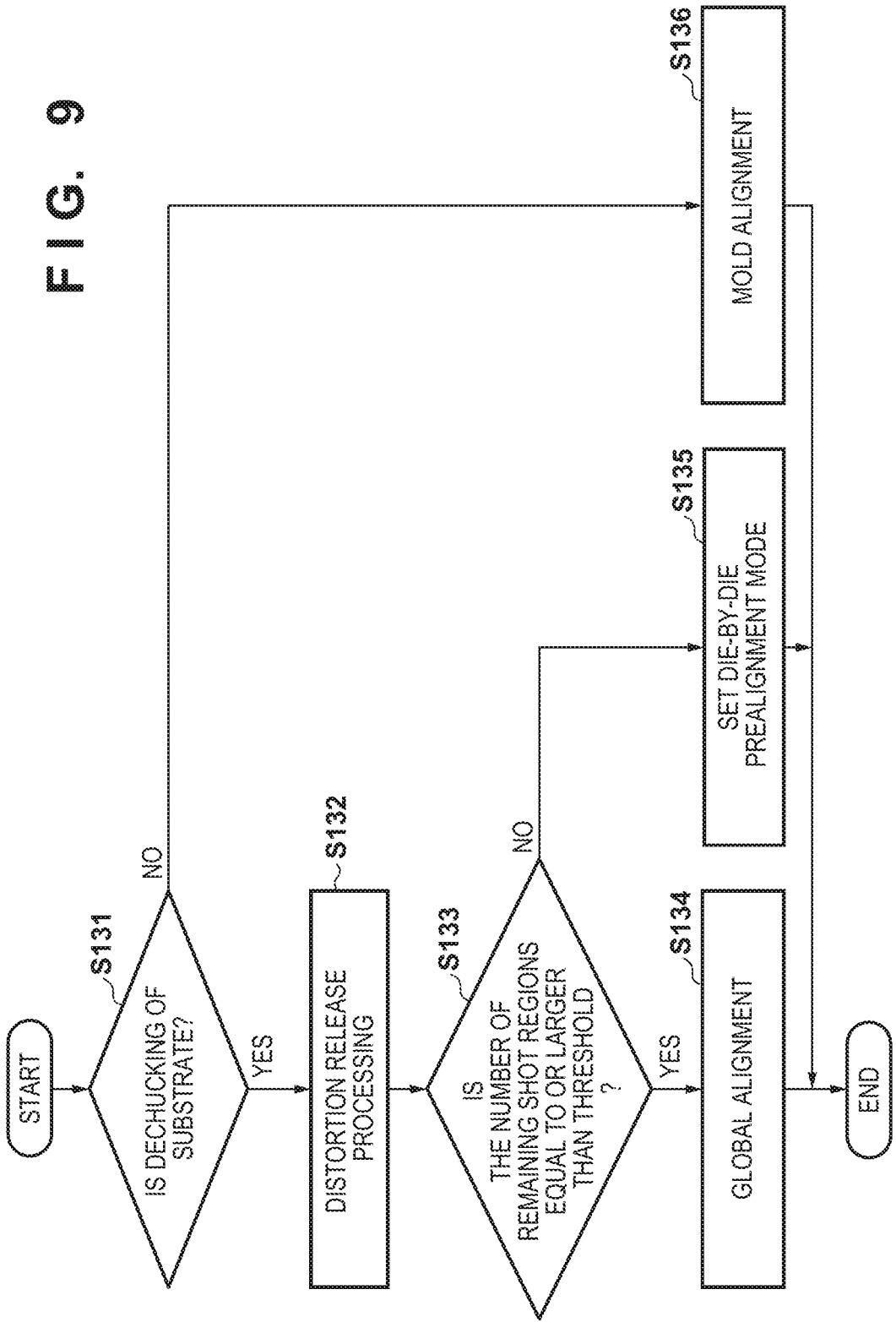
FIG. 9 is a flowchart for explaining realignment processing.

In step S13, realignment processing is performed. FIG. 9 is a flowchart for explaining the realignment processing. In the realignment processing, the subsequent process branches depending on whether dechucking of the substrate 5 has occurred or dechucking of the mold 3 has occurred, that is, depending on the type of the dechucking. More specifically, the sequence is divided into a case of occurrence of dechucking of the substrate 5 and a case of occurrence of dechucking of the mold 3.

In step S131, it is determined whether the dechucking having occurred in the imprint apparatus 1 is dechucking of the substrate 5. If the dechucking having occurred in the imprint apparatus 1 is dechucking of the substrate 5, the process advances to step S132. On the other hand, if the dechucking having occurred in the imprint apparatus 1 is not dechucking of the substrate 5, that is, if it is dechucking of the mold 3, the process advances to step S136. Note that since step S131 is intended to classify the type of the dechucking, it may be determined in step S131 whether the dechucking having occurred in the imprint apparatus 1 is dechucking of the mold 3.

In step S132, distortion release processing is performed. The distortion release processing is processing of temporarily releasing the substrate 5 held again by the substrate stage 6 and causing the substrate stage 6 to hold the substrate 5 again. More specifically, in the substrate stage 6, chucking of the substrate 5 is once turned off, that is, it is released to the atmosphere, thereby releasing the distortion of the substrate 5 by the elasticity of the substrate itself. Thereafter, chucking of the substrate 5 is turned on again to hold the substrate 5. The distortion of the substrate 5 occurs since in the solving processing, the imprint head 4 is lowered while a part of the substrate 5 is lifted, so that the substrate 5 is pressed against the substrate stage 6 in a state in which the substrate 5 (the end portion thereof) is bent by its own weight.

After the distortion of the substrate 5 is released, the position of the substrate 5 held again by the substrate stage 6 is measured. Note that in this embodiment, a sequence of measuring the position of the substrate 5 branches depending on the number of shot regions (to be referred to as "remaining shot regions" hereinafter) having not undergone the imprint process. This is because the pattern of the imprint material has been formed on the substrate so that the underlaying pattern of the substrate 5 may not be measured by the substrate measurement scope 8, or even if it can be measured, the measurement value can be different between before and after the pattern formation.

In step S133, it is determined if the number of the remaining shot regions among a plurality of shot regions on the substrate is equal to or larger than a threshold. If the number of the remaining shot regions is equal to or larger than the threshold, the process advances to step S134. On the other hand, if the number of the remaining shot regions is neither equal to nor larger than the threshold (that is, if the number of the remaining shot regions is smaller than the threshold), the process advances to step S135.

In step S134, global alignment is performed. More specifically, as in step S5, the underlying pattern in each sample shot region on the substrate is measured, and the shot layout on the substrate is obtained from the measurement results in the sample shot regions. Note that the sample shot regions may be selected from the remaining shot regions (the shot regions having not undergone the imprint process). Alternatively, the underlying patterns in all the shot regions on the substrate may be measured to prioritize alignment accuracy, but throughput decreases in this case.

In step S135, a die-by-die prealignment mode (a mode in which the die-by-die prealignment in step S62 is performed in the imprint process) is set. If the number of the remaining shot regions is smaller than the threshold, a sufficient number of sample shot regions may not be secured. Therefore, the die-by-die prealignment mode in which the die-by-die prealignment (step S62) is subsequently performed is set. In the die-by-die prealignment mode, die-by-die prealignment is performed on each of all the remaining shot regions. Since die-by-die prealignment takes time, as has been described above, it is preferable to perform global alignment if the number of the remaining shot regions is equal to or larger than the threshold. Note that even if the number of the remaining shot regions is smaller than the threshold, global alignment may be performed before die-by-die prealignment is performed. However, since this requires an extra time for performing global alignment, only die-by-die prealignment is performed in this embodiment.

In step S136, mold alignment is performed. More specifically, as in step S2, a relative position between the mold 3 and the reference mark 9 is measured by the TTM scope 13, and a positional shift of the mold 3 (the pattern thereof) with respect to the reference mark 9 is obtained. In dechucking of the mold 3, different from dechucking of the substrate 5, information that cannot be used for alignment after the imprint head 4 holding the mold 3 again is only the positional shift of the mold 3 with respect to the reference mark 9. Since other pieces of information can be used for alignment, it is only required to perform mold alignment. Note that the similar alignment accuracy can be obtained by performing die-by-die prealignment, but since die-by-die prealignment takes time, mold alignment alone may be performed.

As has been described above, according to this embodiment, if dechucking has occurred, the mold 3 or the substrate 5 whose dechucking has been solved is not unloaded from the imprint apparatus 1 (the space in which the holding unit holding the mold 3 or the substrate 5 is arranged) but the position of the substrate 5 or the mold 3 is measured again. With this operation, even if dechucking has occurred, the imprint apparatus 1 can continue the imprint process, so that it is possible to minimize decreases in throughput and productivity.

The threshold for, if dechucking of the substrate 5 has occurred, branching (step S133) the sequence of measuring the position of the substrate 5 depending on the number of the remaining shot regions is set as follows. For example, the threshold is set (determined) based on the relationship between the time required for global alignment and the time required for die-by-die prealignment. More specifically, the time required for performing die-by-die prealignment for all the remaining shot regions is compared with the time required for performing global alignment, and the threshold is set such that the alignment requiring the shorter time is performed. For example, assume that the time required for performing die-by-die prealignment on one shot region is 0.5 sec, and the time required for performing global alignment is 5.2 sec. In this case, the threshold may be set to 11, so that die-by-die prealignment is performed if the number of the remaining shot regions is equal to or smaller than 10, and global alignment is performed if the number of the remaining shot regions is equal to or larger than 11. Alternatively, the threshold may be set such that die-by-die prealignment is performed if the remaining shot regions are less than ¼ of all the shot regions or if the number of the remaining shot regions is smaller than the number of the sample shot regions for global alignment.

Figure 10:
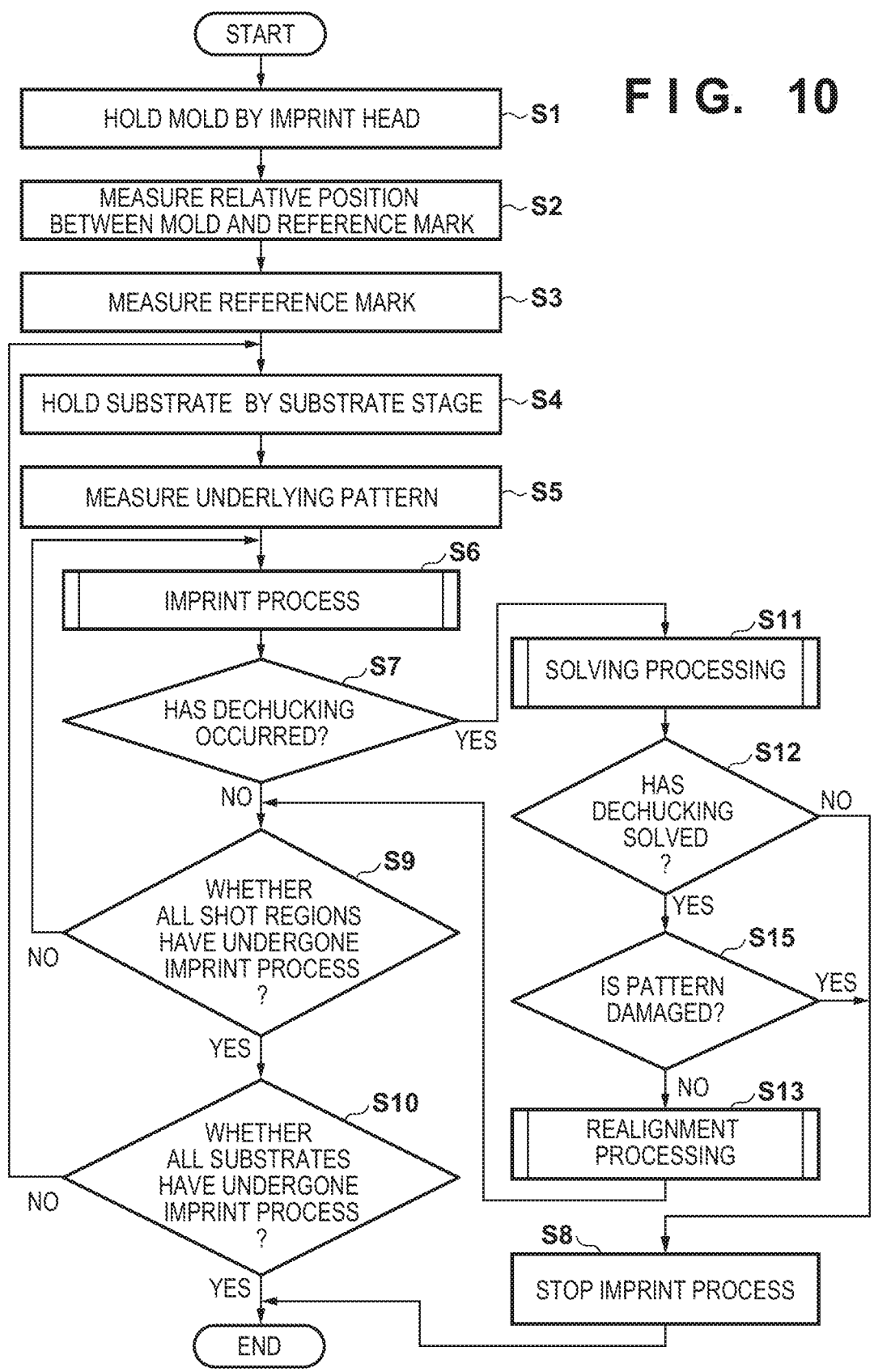
FIG. 10 is a flowchart for explaining another operation of the imprint apparatus according to the embodiment.

In this embodiment, it is premised that even when dechucking has occurred, the pattern of the imprint material has been formed in the shot region at that time. However, in practice, a force larger than that in the normal imprint process may be applied to the cured imprint material 14 on the substrate during the solving processing for solving the dechucking, so that the pattern formed on the substrate may be damaged after mold separation. In such a case, the substrate is to be reworked, so that the subsequent step would be useless. Therefore, as shown in FIG. 10, if the dechucking has been solved (YES in step S12), it may be determined in step S15 whether the pattern formed on the substrate is damaged. If the pattern formed on the substrate is damaged, the subsequent step is not performed and the process advances to step S8. On the other hand, if the pattern formed on the substrate is not damaged, the process advances to step S13 to perform the subsequent step. Note that whether the pattern formed on the substrate is damaged may be determined by setting a threshold of the mold separating force in the mold separation, or may be determined by directly observing the pattern formed on the substrate by a scope or the like. If the pattern formed on the substrate is directly observed, it takes time for observation but the determination accuracy is excellent.

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
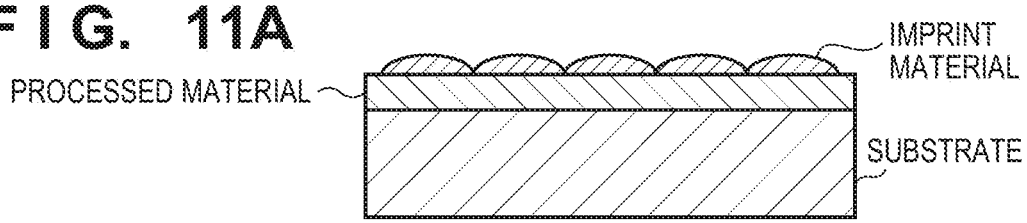
FIGS. 11A to 11F are views for explaining a method of manufacturing an article.

An article manufacturing method will be described in detail next. As shown in FIG. 11A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 11B:
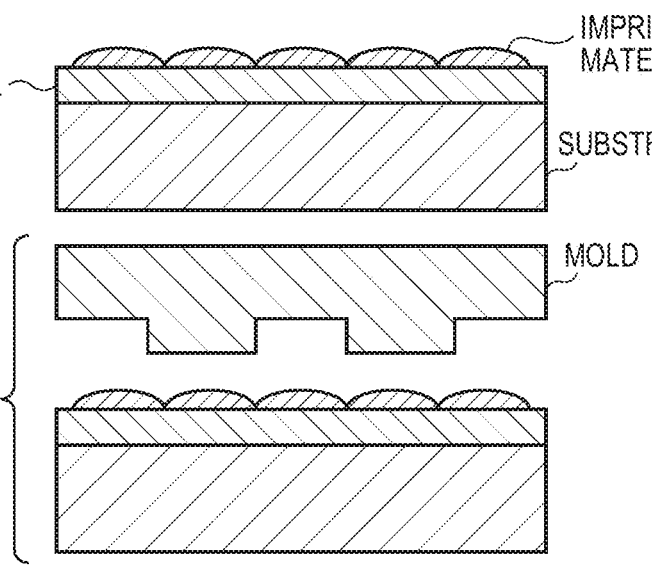
Figure 11C:
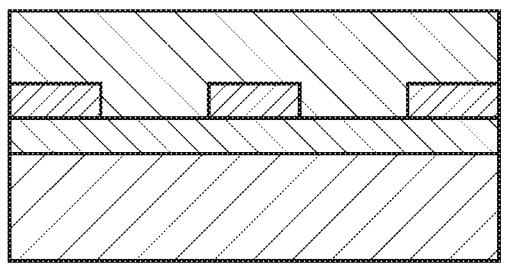

As shown in FIG. 11B, a side of the mold for imprint with an uneven pattern is directed to and caused to face the imprint material on the substrate. As shown in FIG. 11C, the substrate to which the imprint material is applied is brought into contact with the mold, and a pressure is applied. The gap between the mold and the processed material is filled with the imprint material. When the imprint material is irradiated with light serving as curing energy through the mold in this state, the imprint material is cured.

Figure 11D:
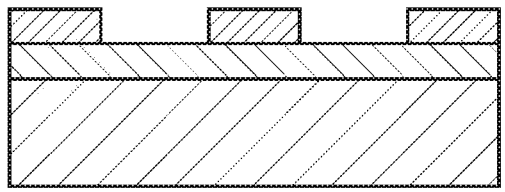

As shown in FIG. 11D, after the imprint material is cured, the mold is separated from the substrate. Thus, the pattern of the cured product of the imprint material is formed on the substrate. In the pattern of the cured product, the concave portion of the mold corresponds to the convex portion of the cured product, and the convex portion of the mold corresponds to the concave portion of the cured product. That is, the uneven pattern of the mold is transferred to the imprint material.

Figure 11E:
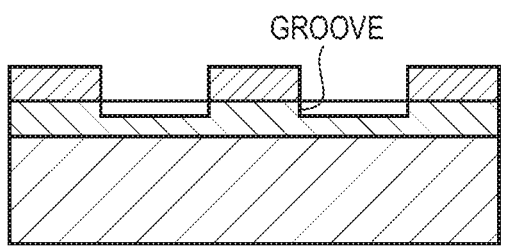
Figure 11F:
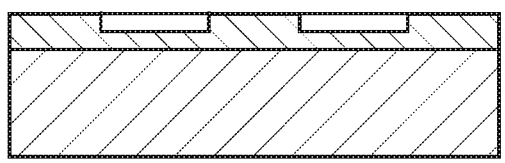

As shown in FIG. 11E, when etching is performed using the pattern of the cured product as an etching resistant mask, a portion of the surface of the processed material where the cured product does not exist or remains thin is removed to form a groove. As shown in FIG. 11F, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-193006 filed on Oct. 23, 2019, which is hereby incorporated by reference herein in its entirety.

What is claimed is:

1. An imprint apparatus that performs an imprint process of forming a pattern of an imprint material on a substrate using a mold, comprising:
    a holding unit configured to hold one of the mold and the substrate as a material;
    a measurement unit configured to measure a position of the material held by the holding unit;
    a detection unit configured to detect dechucking of the material in the holding unit; and
    a control unit configured to control the imprint apparatus to perform the imprint process of forming the pattern of the imprint material by contacting the mold with the imprint material on the substrate and curing the imprint material,
    wherein to cause the imprint apparatus to continue the imprint process in a case where the detection unit has detected the dechucking, the control unit is configured to:
    cause the holding unit to hold the dechucked material again without unloading the material from the imprint apparatus,
    cause the measurement unit to measure a measured position of the mold and the substrate to align the mold and substrate, and
    control the imprint apparatus to perform the imprint process, after alignment is performed using the measured position to align the mold and the substrate.

2. The apparatus according to claim 1, wherein
the substrate includes a plurality of shot regions, and the control unit is configured to control the imprint apparatus to perform the imprint process on each of the plurality of shot regions,
to cause the imprint apparatus to continue the imprint process in the case where the detection unit has detected the dechucking, the control unit is configured to determine whether the dechucked material is the mold or the substrate before causing the measurement unit to measure the measured position, and
in a case where the dechucked material is the substrate, the control unit is configured to cause the measurement unit to obtain a layout of the plurality of shot regions by measuring positions of some shot regions of the plurality of shot regions.

3. The apparatus according to claim 2, wherein the some shot regions of the plurality of shot regions are shot regions having not undergone the imprint process.

4. The apparatus according to claim 1, wherein
the substrate includes a plurality of shot regions, and the control unit is configured to control the imprint apparatus to perform the imprint process on each of the plurality of shot regions,
to cause the imprint apparatus to continue the imprint process in the case where the detection unit has detected the dechucking, the control unit is configured to determine whether the dechucked material is the mold or the substrate before causing the measurement unit to measure the measured position, and
in a case where the dechucked material is the substrate, the control unit is configured to cause the measurement unit to measure a relative position between a shot region and the mold for each shot region of the plurality of shot regions having not undergone the imprint process.

5. The apparatus according to claim 1, wherein
the substrate includes a plurality of shot regions, and the control unit is configured to control the imprint apparatus to perform the imprint process on each of the plurality of shot regions,
to cause the imprint apparatus to continue the imprint process in the case where the detection unit has detected the dechucking, the control unit is configured to determine whether the dechucked material is the mold or the substrate before causing the measurement unit to measure the measured position, and
in a case where the dechucked material is the substrate, the control unit is configured to cause the measurement unit to either (i) obtain a layout of the plurality of shot regions by measuring positions of some shot regions of the plurality of shot regions or (ii) measure a relative position between a shot region and the mold for each shot region of the plurality of shot regions having not undergone the imprint process, depending on a number of shot regions of the plurality of shot regions having not undergone the imprint process.

6. The apparatus according to claim 5, wherein the some shot regions of the plurality of shot regions are the shot regions having not undergone the imprint process.

7. The apparatus according to claim 5, wherein
the control unit is configured to cause the measurement unit to obtain the layout of the plurality of shot regions in a case where the number of shot regions of the plurality of shot regions having not undergone the imprint process is not smaller than a threshold, and
the control unit is configured to cause the measurement unit to measure the relative position between the shot region and the mold for each shot region of the plurality of shot regions having not undergone the imprint process in a case where the number of shot regions of the plurality of shot regions having not undergone the imprint process is smaller than the threshold.

8. The apparatus according to claim 7, wherein the control unit is configured to determine the threshold based on a relationship between a time required for the measurement unit to obtain the layout of the plurality of shot regions and a time required for the measurement unit to measure the relative position between the shot region and the mold for each shot region of the plurality of shot regions having not undergone the imprint process.

9. The apparatus according to claim 2, wherein in a case where the dechucked material is the substrate, the control unit is configured to cause the holding unit to temporarily release the material held again and hold the material again.

10. The apparatus according to claim 2, wherein in a case where the dechucked material is the mold, the control unit is configured to cause the measurement unit to measure a relative position between the mold and a reference mark provided on the holding unit that holds the substrate.

11. The apparatus according to claim 1, wherein
the control unit is configured to determine, after causing the holding unit to hold the dechucked material again, whether the pattern of the imprint material formed on the substrate is damaged, and
in a case where the control unit determines that the pattern of the imprint material is damaged, the control unit does not cause the measurement unit to measure the measured position of the mold and the substrate to align the mold and substrate.

* * * * *